United States Patent [19]
Smith et al.

[11] Patent Number: 5,753,305
[45] Date of Patent: May 19, 1998

[54] RAPID AGING TECHNIQUE FOR AEROGEL THIN FILMS

[75] Inventors: Douglas M. Smith; Gregory P. Johnston; William C. Ackerman, all of Albuquerque, N. Mex.; Shin-Puu Jeng, Plano, Tex.

[73] Assignee: Texas Instruments Incorporated, Dallas, Tex.

[21] Appl. No.: 748,922

[22] Filed: Nov. 14, 1996

[51] Int. Cl.$^6$ .............................. B05D 3/04; B05D 3/00; B05D 5/00; H01L 21/00

[52] U.S. Cl. .................. 427/335; 427/245; 427/246; 427/377; 427/378; 438/795; 438/909

[58] Field of Search .................. 427/245, 246, 427/335, 377, 378; 437/949, 247; 252/315.01; 438/795, 909

[56] References Cited

U.S. PATENT DOCUMENTS

| | | | |
|---|---|---|---|
| 4,230,803 | 10/1980 | Weidenbach et al. | 435/176 |
| 4,713,233 | 12/1987 | Marsh et al. | 423/608 |
| 4,851,150 | 7/1989 | Hench et al. | 252/315.6 |
| 4,954,327 | 9/1990 | Blount | 423/338 |
| 5,076,980 | 12/1991 | Nogues et al. | 264/65 |
| 5,097,317 | 3/1992 | Fujimoto et al. | 357/72 |
| 5,207,814 | 5/1993 | Cogliati et al. | 65/18.3 |
| 5,242,647 | 9/1993 | Poco | 264/225 |
| 5,275,796 | 1/1994 | Tillotson et al. | 423/338 |
| 5,294,480 | 3/1994 | Mielke et al. | 428/240 |
| 5,368,887 | 11/1994 | Hoshino et al. | 427/226 |
| 5,391,364 | 2/1995 | Cogliati | 423/335 |
| 5,409,683 | 4/1995 | Tillotson et al. | 423/338 |
| 5,470,802 | 11/1995 | Gnade et al. | 437/238 |
| 5,472,913 | 12/1995 | Havemann et al. | 437/195 |
| 5,488,015 | 1/1996 | Havemann et al. | 437/195 |
| 5,494,858 | 2/1996 | Gnade et al. | 437/231 |
| 5,496,527 | 3/1996 | Yokogawa et al. | 423/338 |
| 5,504,042 | 4/1996 | Cho et al. | 437/247 |
| 5,523,615 | 6/1996 | Cho et al. | 257/632 |
| 5,525,857 | 6/1996 | Gnade et al. | 313/309 |
| 5,536,965 | 7/1996 | Beratan et al. | 257/444 |
| 5,548,159 | 8/1996 | Jeng | 257/634 |

FOREIGN PATENT DOCUMENTS

| | | |
|---|---|---|
| 90200271 | 2/1990 | European Pat. Off. . |
| 91200939 | 4/1991 | European Pat. Off. . |

OTHER PUBLICATIONS

V.S. Klimenko, L.A. Kulik, and V.V. Vashchinskaya, *Dependence of the Composition and Structure of Silicic Acid Xerogels on the Nature of the Solvent*, 1986, Ukrainskii Khimicheskii Zhurnal, vol. 52, No. 12, pp. 1247-1251.

Norges Tekniske Hogskole, *Preparation and Characterization of Transparent, Monolithic Silica Xerogels with Low Density*, Jan. 1993.

D. Basmadjian, G. N. Fulford, B.I. Parsons, and D.S. Montgomery, *The Control of the Pore, Volume and Pore Size Distribution in Alumina and Silica Gels by the Addition of Water Soluble Organic Polymers* Dec. 1962, Journal of Catalysis, vol. 1, No. 6, pp. 547-563.

H. Yokogawa, M. Yokoyama, *Hydrophobic Silica Aerogels*, Journal of Non-Crystalline Solids 186 (1995) 23-29.

*Primary Examiner*—Michael Lusignan
*Assistant Examiner*—Michael Barr
*Attorney, Agent, or Firm*—James E. Harris; Richard L. Donaldson; James C. Kesterson

[57] ABSTRACT

This invention pertains generally to aging methods suited to aerogel thin film fabrication, and particularly to techniques for improving gel strength and/or aerogel dielectric constant by a rapid aging technique, which avoid damage or premature drying of wet gel thin films during aging. A substrate having a wet gel thin film deposited thereon is contacted with a saturated water vapor atmosphere, preferably at an elevated pressure and a temperature greater than 100° C. The method may comprise a vapor-phase exchange step to remove low boiling point pore liquids such as ethanol prior to or during aging. The method may also comprise a vapor-phase exchange step to replace water in the wet gel with another pore liquid such as acetone to stop the aging process and prepare the wet gel for drying. A vapor-phase aging catalyst (e.g. ammonia) may also be used to enhance the aging process. The present invention allows aging of wet gel thin films to be completed in a few minutes instead of the days generally required for conventional bulk gel aging.

11 Claims, 1 Drawing Sheet

RAPID AGING TECHNIQUE FOR AEROGEL THIN FILMS

FIELD OF THE INVENTION

This invention pertains generally to deposition methods for low dielectric constant thin films on semiconductor substrates, and more particularly to such deposition methods suited to aerogel thin film fabrication.

BACKGROUND OF THE INVENTION

Sol-gel techniques are commonly used to produce dense thin films in semiconductor fabrication. The word sol-gel, however, does not describe a product but a reaction mechanism whereby a sol may be transformed into a gel. A sol is a colloidal suspension of solid particles in a liquid; one method of forming a sol is through hydrolysis and condensation reactions which cause a multifunctional monomer in a solution to polymerize into relatively large, highly branched particles. Many monomers suitable for polymerization are metal alkoxides. For example, a tetraethylorthosilicate (TEOS) monomer may be partially hydrolyzed in water by the reaction

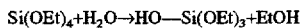
$$Si(OEt)_4 + H_2O \rightarrow HO-Si(OEt)_3 + EtOH$$

Reaction conditions may be controlled such that, on the average, each monomer undergoes a desired number of hydrolysis reactions to partially or fully hydrolyze the monomer; TEOS which has been fully hydrolyzed becomes $Si(OH)_4$. Once a molecule has been at least partially hydrolyzed, two molecules can then link together in a condensation reaction, such as

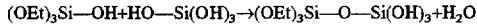
$$(OEt)_3Si-OH + HO-Si(OH)_3 \rightarrow (OEt)_3Si-O-Si(OH)_3 + H_2O$$

or

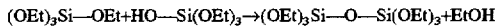
$$(OEt)_3Si-OEt + HO-Si(OEt)_3 \rightarrow (OEt)_3Si-O-Si(OEt)_3 + EtOH$$

to form an oligomer and liberate a molecule of water or ethanol. The Si—O—Si configuration in the oligomer formed by these reactions has three sites available at each end for further hydrolysis and condensation; thus additional monomers or oligomers can be added to this molecule in a somewhat random fashion to create a highly branched polymeric molecule from literally thousands of monomers.

Through continued reactions, one molecule in the sol may eventually reach macroscopic dimensions so that it forms a network which extends throughout the sol; at this point (called the gel point), the substance is said to be a gel. By this definition, a gel is a substance that contains a continuous solid skeleton enclosing a continuous liquid phase. As the skeleton is porous, a gel can also be described as an open-pored solid structure enclosing a pore liquid.

Hydrolysis and condensation reactions do not stop at the gel point. A bulk wet gel, if prevented from drying, continues to change structure over a number of days or weeks in a process known as aging. Aging generally increases average pore size, gel strength and stiffness, primarily because skeletal material preferentially dissolves from regions of positive curvature in the gel structure and preferentially redeposits in regions of negative curvature. This results in a net transport of material from areas of high mechanical strength to areas of low mechanical strength, thus improving overall gel strength without gel densification. For example, FIG. 1 illustrates a particle cluster 10 before aging (A) and after aging (B). The negative curvature "neck" regions between particles in FIG. 1 are strengthened by aging at the expense of the positive curvature regions. This process serves to strengthen the bulk gel with increased aging time, but eventually a maximum strength improvement is reached; beyond this point, the gel begins to weaken with aging, and may eventually break up or even go back into solution.

SUMMARY OF THE INVENTION

The present invention provides a method for rapid aging of aerogel thin films, e.g. for microelectronic applications. It has now been found that for low dielectric constant thin film applications, aging of wet gel films advantageously maximizes aerogel mechanical strength, minimizes aerogel dielectric constant, and creates a narrower pore size distribution. Unfortunately, it has now been found that conventional aging techniques used for bulk gels are poorly suited for aging thin films in semiconductor processing, partly because they generally require liquid immersion of the substrate and partly because they require days or even weeks to complete. The present invention provides a vapor phase aging technique that avoids liquid immersion or premature drying of the wet gel thin film and that, surprisingly, can age such a thin film in a matter of minutes.

Generally and according to the present invention, it has now been found that aging in an atmosphere comprising saturated water vapor avoids the difficulties encountered with liquid immersion aging. Furthermore, the present invention provides several approaches for aging wet gels at increased temperatures. These methods may be used even when the wet gel originally contains low boiling point pore liquids. Finally, the present invention provides for adding a vapor phase aging catalyst to the water vapor atmosphere to speed aging.

In one aspect of the invention, a method is provided for forming a porous dielectric on a semiconductor substrate. This method comprises providing a semiconductor substrate having a wet gel thin film deposited thereon, the wet gel thin film having at least one pore liquid with a boiling point lower than the boiling point of water. The method further comprises contacting the wet gel thin film with an atmosphere comprising saturated water vapor at a temperature greater than the boiling temperature of the pore liquid at 1 atmosphere pressure. This allows the film to be aged rapidly while without premature drying. Preferably, substantially all low boiling point pore liquid is exchanged for water prior to raising the temperature above the boiling temperature of the low boiling point pore liquid. However, the contacting step may comprise increasing the pressure of the atmosphere to a pressure greater than 1 atmosphere prior to or while increasing the temperature, thereby avoiding boiling of pore liquids.

BRIEF DESCRIPTION OF THE DRAWINGS

The present invention, including various features and advantages thereof, may be best understood with reference to the following drawings, wherein.

DETAILED DESCRIPTION OF THE PREFERRED EMBODIMENTS

Figure 1:
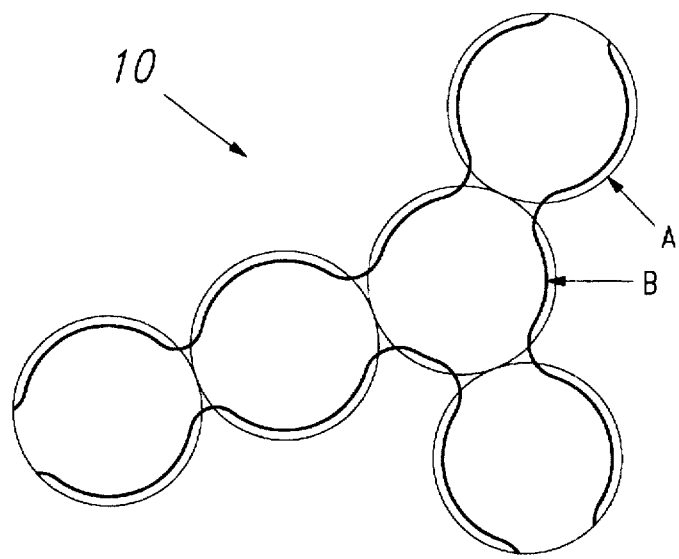
FIG. 1 shows an illustrative gel segment before and after aging.

An ungelled sol may be dip-coated or spin-coated onto a substrate to form a thin film (on the order of several microns or less in thickness, more preferably less than 1 micron). This film has been typically gelled and dried to form a desired structure. In prior practice, a sol-gel thin film is usually subjected to rapid evaporation of volatile components, such that the deposition, gelation, and drying phases may all take place almost simultaneously as the film rapidly collapses and densifies during uncontrolled drying. Such deposition techniques do not lend themselves to, and would not significantly benefit from, wet gel aging.

A dried gel which is formed by collapsing and densifying a wet gel during drying is termed a xerogel. A xerogel is usually dense with just a few percent porosity remaining after drying. In contrast, U.S. Pat. application Ser. No. 08/247,195 now U.S. Pat. No. 5,470,802 issue November 28, to Gnade, Cho and Smith discloses a process for producing an aerogel thin film on a semiconductor substrate; an aerogel is distinguishable from a xerogel primarily by a manner of drying which largely avoids pore collapsation during drying of the wet gel; this results in a substantially undensified thin film which can be fabricated with almost any desired porosity (thin films with greater than 90% porosity have been demonstrated). Such films have been found to be desirable for a low dielectric constant insulation layer in microelectronic applications.

Aging is preferred for aerogels used as low dielectric constant insulators in microelectronic circuits. Two aerogels may possess identical porosities (the percentage of gel volume not in the solid phase) and yet have vastly different mechanical strengths and dielectric constants. It has now been found that thin film aging beneficially increases mechanical strength and decreases dielectric constant, primarily by eliminating extremely small pores and decreasing the internal surface area of the gel.

Bulk gels aging techniques immerse the gel monolith in a liquid (typically this liquid is simply the mother liquor which remains in the pores after gelation); several difficulties in employing immersion to age thin films have now been discovered. First, the process of immersion itself, performed either by dispensing a liquid onto the film or dipping the substrate into a bath, can damage or delaminate the fragile wet gel film structure. Second, immersing presents a reservoir of liquid which may appear almost infinite in relation to the small amount of liquid actually contained in the wet gel pores (e.g. an immersion bath only 1 mm deep presents 2500 times the liquid contained in a 0.5 micron thick, 80% porous wet gel). In this case, the aging bath may dissolve enough of the wet gel to permanently weaken or destroy the gel structure. Finally, immersion baths can contain significant particulate contamination which may deposit on the film and decrease device yield.

Immersion is not the only problem with conventional bulk gel aging. Aging at room or slightly elevated temperature typically requires days or weeks to reach maximum gel strength; processes with such a time requirement are prohibitively long for most semiconductor applications. It has now been found that high aging temperatures can advantageously reduce thin film aging time to a matter of minutes.

Several problems exist for aging thin films at higher temperatures, particularly without immersion. First, premature evaporation of the pore fluid usually collapses the desired aerogel structure. Second, the mixture of pore liquids typically present in the mother liquor (such as ethanol and water in a TEOS-based sol) slows the aging process. Third, the boiling point of low vapor pressure solvents may prevent raising the temperature to the desired level, as the solvent may rapidly vaporize in the film, thereby disrupting the film structure. And finally, the boiling point of water itself presents a similar barrier to increasing temperature beyond 100° C.

The boiling point of a liquid is defined herein to be any combination of temperature and pressure on the liquid-vapor phase transition For a particular liquid; as such, a pressure and temperature condition higher than the boiling point is defined as falling on the vapor side of the phase transition, and a pressure and temperature condition lower than the boiling point is defined as falling on the liquid side of the phase transition. A low boiling point liquid is defined herein as a liquid which boils at a temperature and pressure insufficient to boil water. A saturated water vapor atmosphere is defined herein as an atmosphere which is substantially saturated in water vapor at the substrate (it may also be supersaturated). As used herein, an aging catalyst is a material which raises the solubility of a solid gel material in water.

The following examples present some specific preferred techniques for forming aerogel low dielectric constant insulation films using wet gel thin film aging.

A stock solution may be prepared by combining TEOS, ethanol, water and nitric acid in the approximate molar ratio 1:3:1:0.0007 and refluxing this solution for 1.5 hours at 80° C. The solution may be further diluted using additional ethanol, water, and/or other suitable alcohols or solvents such as acetone. Generally, a stock solution suitable for spinon application may contain 1–15% equivalent weight percent of alkoxide. Typically the stock solution is stored at low temperature prior to use to maintain a desired stability.

The stock solution may be applied to a semiconductor wafer by dispensing 3–5 ml onto the wafer, and then spinning the wafer at 1500 to 5000 rpm for about 5–10 seconds, preferably in a saturated ethanol/water atmosphere to prevent premature drying of the film. Ammonia, for example, is a catalyst which may be added to this atmosphere at some point to initiate or speed gelation.

In one embodiment of the invention, substantially all low-boiling point alcohol or other low-boiling solvent is removed from the film prior to significant aging. However, a small amount of alcohol may remain or continue to be produced through hydrolysis or condensation during aging (e.g. ethanol may be produced in TEOS-based sols, or methanol in TMOS-based sols), but in an amount generally insufficient to cause damage to the film. Low boiling point liquids may be removed by contacting the substrate with a saturated water vapor atmosphere at a temperature preferably slightly below the boiling point of the low boiling point liquid. For instance, ethanol pore liquid may be exchanged for water by placing a substrate having a wet gel thin film in a saturated water vapor atmosphere at ambient pressure and a temperature less than 78.3° C. It may be preferable to maintain the substrate at a temperature slightly lower than that of the atmosphere to aid in the condensation of some water on the substrate.

Removal of the low-boiling solvents not only helps drive the aging reaction, but allows increased temperatures to be used to speed aging. Once such solvents have been substantially replaced with water, the temperature of the atmosphere may be raised above the boiling point of the low boiling point liquid (e.g. above 78.3° C. for ethanol) and maintained at a temperature below 100° C. It has been found that aging which takes 15 hours at 70° C. may be accomplished in approximately 1 hour at 100° C. Generally, the temperature of the substrate is maintained at or slightly below the temperature of the atmosphere during aging to avoid evaporation from the substrate.

In another preferred embodiment, aging is performed as above but at increased atmospheric pressure. For example, saturated steam at 2.3 atmospheres and 1251° C. may be used to age a wet gel thin film in about 5 minutes. Methods for producing desired atmospheric conditions are well known. For example, atmospheric control may be accomplished in a pressurized chamber, and may include a water evaporator in an atmosphere circulation loop to insure saturation.

In yet another embodiment, increased pressure and temperature may be used to age a wet gel thin film without replacement of low-boiling point liquids, by increasing pressure appropriately such that increased temperature does not boil such liquids. In this embodiment, low-boiling point liquids may nonetheless be removed from the thin film during aging unless the atmosphere is further controlled to prevent this occurrence. It is generally preferred to allow an alcohol reaction product of hydrolysis or condensation to evaporate, as this also speeds aging.

The above-described aging techniques may also use a vapor-phase catalyst to enhance aging. Such a catalyst may be introduced during aging, or may remain in the atmosphere from gelation. Typical catalysts are ammonia, ammonium hydroxide, methylamine, hydrogen fluoride, ammonium fluoride, sodium hydroxide, potassium hydroxide, and combinations thereof.

As aging is strongly dependent on temperature, aging may be retarded by returning the aging atmosphere to ambient pressure and temperature conditions. Aging does not stop completely until water and aprotic solvents are removed from the wet gel by drying or exchange. As it is generally not preferred to dry an aerogel from water, an exchange of a desired drying liquid for water is usually performed. Advantageously, this exchange may be performed rapidly while the wet gel thin film remains at elevated temperature and pressure, using a vapor phase solvent exchange. For example, the aging atmosphere may be saturated in acetone and reduced in water vapor at some point to force an exchange. As before, cooling the wafer slightly below the atmosphere temperature may insure that acetone replaces water as the pore liquid without collapsing the wet gel pores.

The wet gel film may subsequently be dried without substantial densification by one of several methods, including supercritical fluid (extraction. However, the preferred method is to surface modify the pore surfaces in the wet gel prior to drying, using a modifying agent such as trimethylchlorosilane, and follow this with slow drying of the film in a controlled atmosphere.

Figure 2:
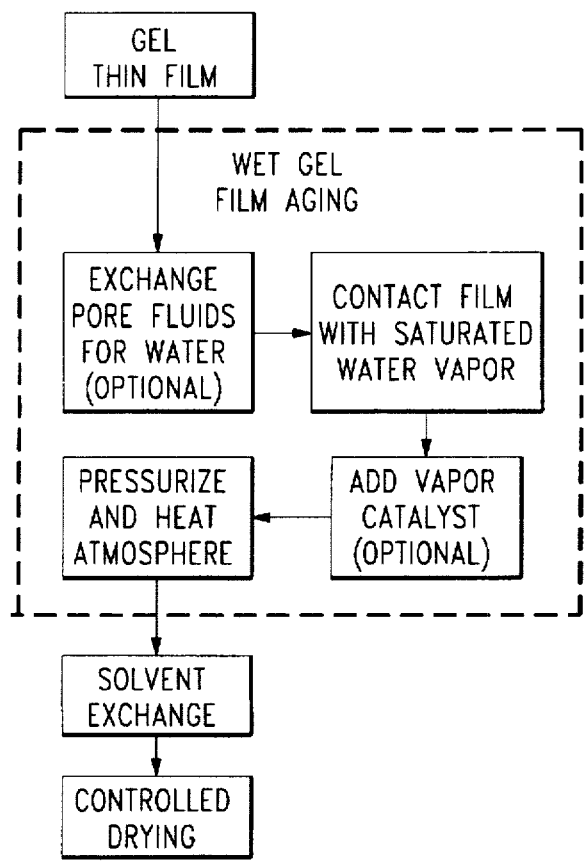
FIG. 2 is a flow chart of a deposition process according to the present invention.

FIG. 2 contains a flow chart of a general method for forming an aerogel thin film using aging according to the present invention. Many of these steps may be modified within the scope of the invention, and other steps can be included to enhance the overall process. For example, deposition, gelation and/or drying may be performed at increased pressure or temperature, such that one chamber may he used for all aerogel processing. As pressure is not believed to significantly affect the aging process itself (other than preventing boiling of pore liquid), the pressure selected for aging may even be a hundred atmospheres or more, e.g. if supercritical drying is to be used.

Although TEOS has been used as a representative example, other alkoxides may be used either alone or in combination with TEOS or each other to form a silica network. These alkoxides include tetramethylorthosilicate (TMOS), methyltriethoxysilane (MTEOS), and 1,2-Bis (trimethoxysilyl)ethane (BTMSE). A sol may also include particulate silica, be formed from alkoxides of other metals such as aluminum and titanium, or be formed from an organic precursor.

What is claimed is:

1. A method of forming a porous dielectric or a semiconductor substrate, said method comprising the steps of:

providing a semiconductor substrate having a wet gel thin film deposited thereon, said wet gel thin film having a pore liquid comprising a low boiling point liquid; replacing substantially all of said low boiling point liquid with water; and contacting said wet gel thin film with an atmosphere comprising saturated water vapor at a first temperature greater than the boiling temperature of said low boiling point liquid at 1 atmosphere pressure, thereby aging said thin film while maintaining said wet gel thin film in a wetted state.

2. The method of claim 1, wherein said contacting step comprises increasing the pressure of said atmosphere to a first pressure greater than 1 atmosphere.

3. The method of claim 1, wherein said contacting step comprises increasing the pressure of said atmosphere to a first pressure greater than 1 atmosphere, and increasing the temperature of said atmosphere to a first temperature greater than 100°C.

4. The method of claim 1, wherein said atmosphere further comprises an aging catalyst vapor.

5. The method of claim 4, wherein said aging catalyst vapor is selected from the group consisting of ammonia, ammonium hydroxide, methylamine, hydrogen fluoride, ammonium fluoride, sodium hydroxide, potassium hydroxide, and combinations thereof.

6. The method of claim 1, wherein during at least one segment of said contacting step, said substrate is maintained at a temperature less than said first temperature of said atmosphere, thereby causing water to condense on said substrate.

7. The method of claim 1, further comprising the step of contacting said substrate with a second atmosphere comprising a solvent vapor and comprising unsaturated water vapor, thereby causing said solvent to condense on said thin film and water to evaporate from said thin film, whereby water in said wet gel thin film may be exchanged with said solvent to terminate aging of said wet gel thin film.

8. A method of forming a porous dielectric or a semiconductor substrate, said method comprising the steps of:

providing a semiconductor substrate having a wet gel thin film deposited thereon, said wet gel having a pore liquid comprising water and at least one alcohol that is a low boiling point liquid;

contacting said thin film with an atmosphere saturated in water vapor but unsaturated in said alcohol, at a first temperature and pressure condition less than the boiling point of said alcohol;

maintaining said atmosphere until substantially all of said alcohol evaporates from said thin film, thereby replacing said alcohol in said wet gel with water;

adjusting said atmosphere to a second temperature and pressure condition higher than the boiling point of said alcohol and less than the boiling point of water;

maintaining said atmosphere at said second temperature and pressure condition for less than 1 hour; and drying said wet gel while retaining the porous structure thereof, thereby forming an aerogel thin film.

9. The method of claim 8, wherein said first pressure condition is greater than 1 atmosphere.

10. The method of claim 8, wherein said second pressure condition is greater than 1 atmosphere.

11. A method of aging a wet gel thin film deposited on a semiconductor substrate, said method comprising the steps of:

contacting said wet gel thin film with an atmosphere comprising saturated water vapor at a first temperature greater than 100° C. and a first pressure greater than 1 atmosphere, said first temperature and pressure less than the boiling point of water; and maintaining said contact for less than 1 hour.

* * * * *

UNITED STATES PATENT AND TRADEMARK OFFICE
CERTIFICATE OF CORRECTION

PATENT NO.   : 5,753,305  
DATED        : May 19, 1998  
INVENTOR(S)  : Douglas M. Smith, Gregory P. Johnston, William C. Ackerman, Shin-Puu Jeng Page 1 of 1

It is certified that error appears in the above-identified patent and that said Letters Patent is hereby corrected as shown below:

Title page, Item [60],
Continuing Data, add "Provisional application No. 60/006,852, November 16, 1995.

Column 1,
Between lines, 1 and 2 add -- This application claims priority under 35 U.S.C. § 119(e)(1) of provisional application number 60/006,852 filed 11/16/95: --

Signed and Sealed this

Sixteenth Day of October, 2001

Attest:

*Nicholas P. Godici*

NICHOLAS P. GODICI  
*Attesting Officer*  *Acting Director of the United States Patent and Trademark Office*